United States Patent
Clevenger et al.

(10) Patent No.: US 6,638,681 B2
(45) Date of Patent: Oct. 28, 2003

(54) X-RAY PRINTING PERSONALIZATION TECHNIQUE

(75) Inventors: Lawrence A. Clevenger, LaGrangeville, NY (US); David B. Goland, New Paltz, NY (US); Louis L. Hsu, Fishkill, NY (US); Joseph F. Shepard, Jr., Fishkill, NY (US); Subhash L. Shinde, Cortlandt Manor, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/281,677

(22) Filed: Oct. 28, 2002

(65) Prior Publication Data

US 2003/0044590 A1 Mar. 6, 2003

Related U.S. Application Data

(62) Division of application No. 09/910,763, filed on Jul. 24, 2001.

(51) Int. Cl.[7] ............................. G03F 7/00; H05K 3/02
(52) U.S. Cl. ...................... 430/198; 430/311; 430/967
(58) Field of Search ............................. 430/198, 311, 430/966, 967, 330

(56) References Cited

U.S. PATENT DOCUMENTS

| | | | |
|---|---|---|---|
| 3,732,792 A | 5/1973 | Tarnopol et al. | |
| 3,988,647 A | 10/1976 | Bolon et al. | |
| 4,049,844 A | 9/1977 | Bolon et al. | |
| 4,828,961 A | * 5/1989 | Lau et al. ................... | 430/198 |
| 5,174,925 A | 12/1992 | Fujii et al. | |
| 5,480,503 A | 1/1996 | Casey et al. | |
| 5,756,234 A | 5/1998 | Groves et al. | |
| 6,013,713 A | 1/2000 | Cotte et al. | |
| 6,221,503 B1 | 4/2001 | Cotte et al. | |
| 6,498,349 B1 | 12/2002 | Thomas et al. | |

FOREIGN PATENT DOCUMENTS

GB          2 350 727 A    * 12/2000

\* cited by examiner

*Primary Examiner*—John A. McPherson
(74) *Attorney, Agent, or Firm*—McGinn & Gibb, PLLC; Kevin Jordan, Esq.

(57) ABSTRACT

A method and structure to form a conductive pattern on a ceramic sheet deposits a photosensitive conductive material on a carrier and exposes a pattern of x-ray energy on the material and sinters the carrier and the material to the ceramic sheet so that only the conductive pattern of the material remains on the ceramic sheet. The structure has a conductive patterned material which includes a photosensitive agent.

12 Claims, 2 Drawing Sheets

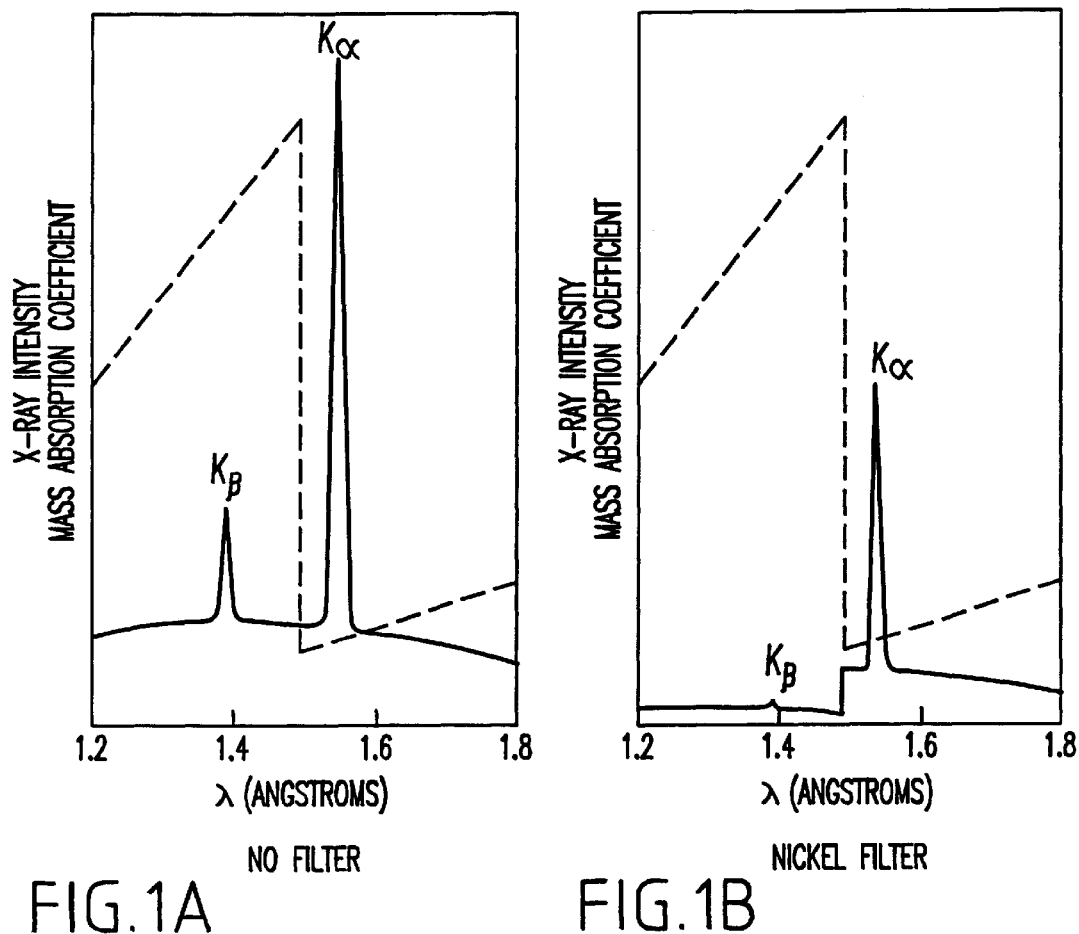
FIG.1A NO FILTER
FIG.1B NICKEL FILTER
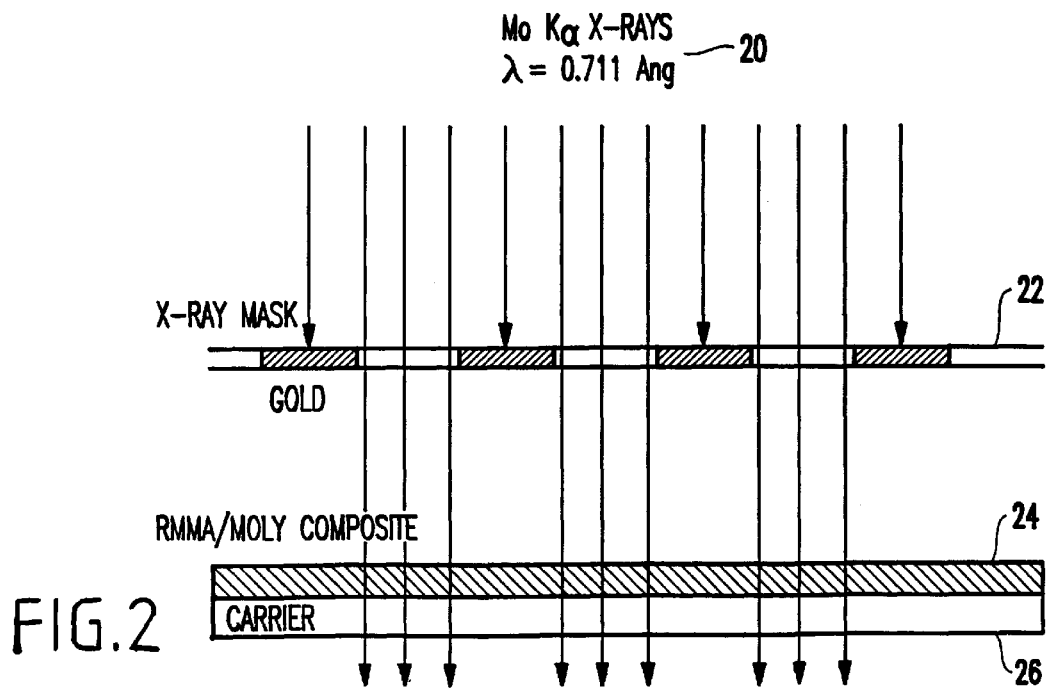
FIG.2

X-RAY PRINTING PERSONALIZATION TECHNIQUE

CROSS-REFERENCE TO RELATED APPLICATIONS

This application is a division of U.S. application Ser. No. 09/910,763 filed Jul. 24, 2001.

BACKGROUND OF THE INVENTION

1. Field of the Invention

The present invention generally relates to printing wiring patterns on greensheets and more particularly to an improved process for personalizing green sheets that utilizes X-ray printing.

2. Description of the Related Art

Large ceramic sheets that are used in the electronic industry are referred to as "greensheets". Such greensheets are used as a platform (e.g., board) to form connections between prefabricated integrated circuit chips. Such greensheets normally contain standard wiring patterns; However these wiring patterns can be customized (personalized) to accommodate the specific needs of given designs.

Traditionally, the personalization of greensheets was performed using screen printing techniques. However, screen printing techniques suffer from a number of disadvantages. For example, the masks used to perform the screen printing have a very limited life and screen printing has limited resolution.

Thus, as the line widths and spacings of circuit patterns on ceramic packages continue to decrease, the limits of traditional screen printing techniques are being approached. To meet the ever more aggressive design criteria, it is desirable to continue tightening the ground rules of the package while maintaining the speed and relative simplicity of screen printing. The invention described below resolves these problems via the utilization of X-ray lithographic methods and composite photo resists.

SUMMARY OF THE INVENTION

In view of the foregoing and other problems, disadvantages, and drawbacks of the conventional greensheet personalization processes, the present invention has been devised, and it is an object of the present invention to provide a structure and method for X-ray greensheet printing.

In order to attain the object(s) suggested above, there is provided, according to one aspect of the invention, a method which forms a conductive pattern on a ceramic sheet and deposits a photosensitive conductive material on a carrier. The invention then exposes a pattern of x-ray energy on the material and sinters the carrier and the material to the ceramic sheet such that only the conductive pattern of the material remains on the ceramic sheet. After the exposing, the invention develops the material and rinses the material to remove portions of the material patterned by the exposing so that the conductive pattern matches the pattern of x-ray energy. The exposing process exposes the pattern of x-ray energy through a non-contact mask. The sintering process removes the carrier and allows only the material to remain on the ceramic sheet. The material is a composite of a metal and a photosensitive agent which includes one of gold, nickle, molybdenum, and copper.

The invention further includes a wiring structure which has a photosensitive agent that is an exposed and developed photosensitive agent. The material of the structure is one of gold, nickle, molybdenum, and copper. The wiring structure includes a ceramic substrate which is a ceramic greensheet. The invention also contains a photosensitive agent which is one of polymethyl methacrylate and polybutene-1 sulfone.

BRIEF DESCRIPTION OF THE DRAWINGS

The foregoing and other objects, aspects and advantages will be better understood from the following detailed description of a preferred embodiment(s) of the invention with reference to the drawings, in which:

FIG. 1A is a graph showing adsorption of X-rays at different wavelengths for a given metal filter;

FIG. 1B is a graph showing adsorption of X-rays at different wavelengths for a given metal filter;

FIG. 2 is a schematic cross-sectional diagram of a composite being exposed with X-rays through a mask in a process according to the invention.

DETAILED DESCRIPTION OF PREFERRED EMBODIMENTS OF THE INVENTION

Figure 3:
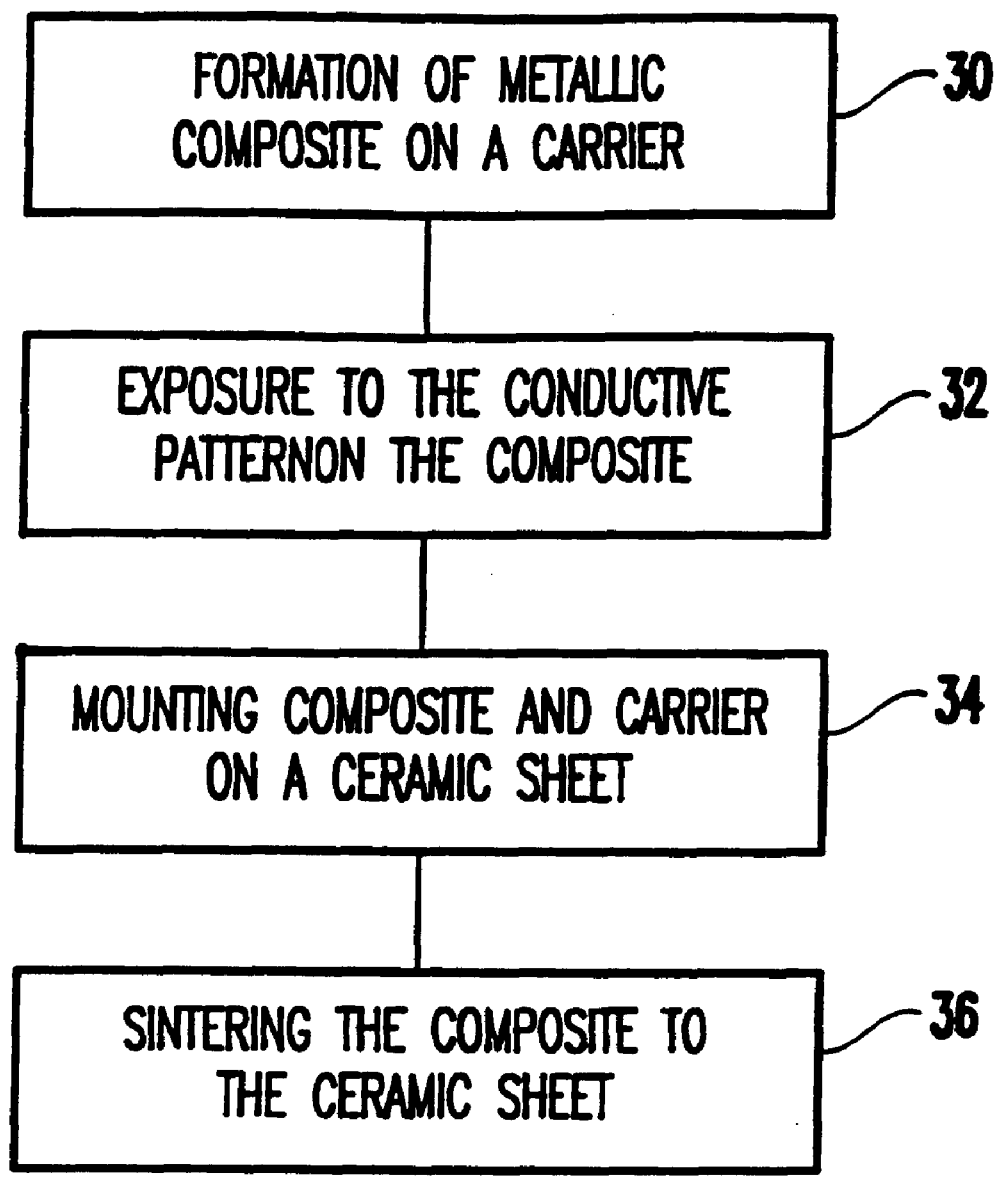
FIG. 3 is a flow diagram illustrating a preferred method of the invention.

In order to address the drawbacks of the conventional processes discussed in the background section, the invention exposes a metal/polymer composite photoresist 24 to a flux of X-radiation 20 (as shown in FIG. 2). The composite resist's 24 relative transparency to X-rays, when compared to other forms of radiation (e.g. UV or visible light), is capable of defining fine line widths with large aspect ratios. Moreover, the X-rays 20 and photoresist 24 are preferably engineered with desired wavelengths (via the proper selection of acceleration voltage and X-ray source) and chemistries in order to optimize exposure times and the depth of the circuit pattern.

X-ray printing requires the proper selection of wavelength in order to maximize the radiation flux through the composite resist (and thus minimize exposure time). As an illustration, the interplay between incident wavelength and X-ray absorption is illustrated in FIGS. 1A and 1B for a nickel Cu—K $\beta$ filter (B. D. Cullity, *Elements of X-Ray Diffraction*, 2nd Ed., Adison Wesley, 1978, pg. 20.) When passed through the filter, the K $\beta$ component of the incident radiation is severely reduced due to the large mass absorption coefficient of nickel at the Cu—K $\beta$ wavelength, as shown in FIG. 1B. Conversely, as shown in FIG. 1A, the K $\alpha$ radiation has a wavelength slightly greater than nickel's K absorption edge which allows a much larger fraction of K $\alpha$ radiation to pass through the filter (the relation between incident wavelength and mass absorption coefficient is exponential).

To optimize the process, this invention utilizes K$\alpha$ radiation emitted from a source material consistent with the desired metallic conductor, e.g. molybdenum. K$\alpha$ radiation is chosen for a number of reasons; (1) the K$\alpha$ wavelength is characteristic for a given element and the minimum voltage required to produce that wavelength may be readily calculated and (2) the absorption coefficient of the metallic component of the composite resist is minimized which maximizes penetration depth and enhances resolution (by limiting lateral exposure).

Referring more specifically to FIG. 2, one implementation of the invention is shown. In FIG. 2, molybdenum K$\alpha$ X-rays (e.g., $\lambda$=0.711 ang.) 20 are delivered through an appropriate photomask 22 to a carrier plate 26 that has been previously spin coated with a thin layer of composite photoresist 24.

X-ray resists operate on the principle of chemical bond breaking, or chain scission, which is caused by the fluorescence of a resist molecule upon absorption of an incident X-ray. Examples of common X-ray resists include poly methyl methacrylate or poly butene-1 sulfone, abbreviated as PMMA and PBS, respectively. It should be noted that numerous resist compositions might be applicable to this invention, both positive and negative in nature. Selection of an appropriate resist will depend on the properties of the conductor used, the solids loading desired (i.e. percent metal/percent resist), and the process control necessary.

The X-ray mask 22 is constructed using techniques common to the semiconductor industry. In this example, the pattern is defined on the mask 22 using a thin layer of gold (or other high atomic number material such as lead, platinum or bismuth) deposited to a thickness dictated by the relative intensity of the X-radiation needed to effectively define the circuit pattern in the composite resist. The composite resist 24 is exposed for a time required to completely define the pattern through the bulk of the film 24. That time will be dependent upon the wavelength of the incident radiation, the absorption coefficient of the composite resist, the thickness of the resist, and the radiation flux of the X-ray source.

To minimize required exposure time, the wavelength used in this invention is tuned to the K absorption edge of the conductor used in the resist. The K absorption edge is specific to each element and is defined physically as the energy required to eject an electron from the K shell of a target atom. When the energy of the incident electrons in an X-ray tube are greater than that required for the ejection of an electron from the K shell, radiation of characteristic wavelengths, termed K$\alpha$ and K$\beta$ radiation are emitted from the target. Because the X-ray source is constructed from the same material as the conductor, absorption of K$\alpha$ radiation is minimized, flux through the resist is maximized, and exposure times are reduced.

Typical conditions for X-ray printing would consist of the casting (via spin coating of liquid resist or fastening or solid sheets of previously cast resist) of an metal impregnated resist with a solid loading of greater than 50% onto an planer carrier substrate (e.g. plate glass). The thickness of the resist will be less than 2 mm with particle sizes in the range of 10 to 100 $\mu$m in diameter. The X-ray source is activated with a acceleration voltage greater than the critical value required for generation of K$\alpha$ radiation from the X-ray target (e.g. $V_{crit}$=20.01 kV for molybdenum). The intensity of the emitted radiation may be increased by raising the acceleration voltage with typical fluxes at about 1W/cm$^2$.

To maintain sufficient intensity $I_x$ of the incident radiation $I_o$ (and thus minimize exposure times via reduction of the flux absorbed by the metal particles) the mass absorption of the composite resist $\mu/\rho_{composite}$ should be minimized as illustrated in equation (x).

$$I_x = I_o e^{-(\mu/\rho)\rho x} \quad (x)$$

Mass absorption of a composite resist can be expressed as a weighted average of the mass absorption coefficients of its constituent components, i.e. metal conductor and polymer resist. The quantity is expressed as:

$$\mu/\rho_{composite} = w_{metal}(\mu/\rho) + w_{resist}(\mu/\rho)(x)$$

where $w_{metal}$ and $w_{resist}$ are the weight fractions of the metal and resist, respectively and $\mu/\rho$ are their mass absorption coefficients.

For the case of a molybdenum target generating K$\alpha$ radiation ($\lambda$=0.711 A), a PMMA based ($\mu/\rho_{resist}$<1) resist containing 50% molybdenum ($\mu/\rho_{Mo}$~18) will have an absorption coefficient on the order 10 in accordance with equation (x).

In order to make the process as efficient as possible therefore, it becomes necessary to minimize the quantity $\mu/\rho_{composite}$. For a given weight percent of metal that is accomplished by minimizing the quantity $\mu/\rho_{metal}$ via the utlization of an X-ray tube with target material identical to the conductor.

After X-ray exposure, the circuit pattern formed in the resist 24 is chemically developed, rinsed and transferred to a ceramic greensheet. The process of transferring the resist 24 to the greensheet is preferably a sintering process. The sintering process will dissolve the carrier 26, leaving the patterned conductive photoresist 24 in place on the personalized greensheet.

The inventive process is shown in flowchart form in FIG. 3. More specifically, the item 30 first forms a metallic composite 24 on a carrier 26. Then in item 32 there occurs exposure of the conductive pattern on the composite 24. Also, item 34 shows mounting the composite 24 and the carrier 26 on a ceramic sheet and, item 36 of the invention, sintering of the composite 24 to the ceramic sheet is complete.

The inventive X-ray printing technique provides a means by which the ground rules of microelectronic packaging can continue to be reduced. At present, "advanced ground rules" packages are designed with line widths of about 37 $\mu$m. In contrast, the resolution of X-ray lithographic methods has been reported at less than 0.1 $\mu$m. The X-ray methods described here may be used with a number of different metallurgies (e.g. molybdenum, copper, etc.) and the wavelengths of the incident radiation can be tuned to optimize the exposure times.

In addition to the reduction of line widths and spacings, X-ray personalization has a number of other potential advantages. The technique is non-contact and will therefore reduce the number of masks required (compared to current screen printing technologies), the masks need not be cleaned, and an alteration of ground rules does not dictate an adjustment of paste rheology. The metal/photoresist composite can be formulated with a singular composition and optimized for sintering and electrical characteristics. Also, the inventive technique is cleaner with less chance for contamination of the pattern with debris, particles, or paste flakes and the paste/sheet interaction is eliminated.

The same problem (i.e. shrinking line widths and spacings) has been identified previously. One conventional solution attempts to rectify the situation via the utilization of ultraviolet lithographic methods using gold and silver impregnated photoresists. Patterns which result have fine line widths (1 to 2 mil) but suffer from shallow thickness' (6.5 um).

Another conventional solution utilizes "pad printing" techniques in which metal containing inks (e.g. 70 Ag/30 Pd) are transferred to the desired substrate. This procedure uses a chemically etched or laser ablated cliche' (i.e. template) to hold the metal containing ink in the desired circuit geometry. A highly compliant elastomeric pad is then pressed into the cliche', lifted out, and pressed onto the desired substrate thereby transferring the circuit material. Line widths from 25 um to 600 um have been reported. However, the pad printing method has the potential for a lack of dimensional control, the possible introduction of contamination, the possible mechanical deformation of the substrate, and the need for application specific inks.

The inventive X-ray printing technique is better than both alternatives described above. The inventive method improves upon the conventional ultraviolet lithographic method's ground rules by an order of magnitude, yield lines thicker in the z-direction, and is applicable to an extensive number of conductors.

Z-direction thickness is limited as result of the UV radiation used. The wavelength of UV radiation is ~3 orders of magnitude (i.e. 1000 times) longer than x-radiation and as such the energy is ~3 orders of magnitude less (E~1/wavelength). Therefore, when UV is used to expose composite resist it is attenuated (via absorption and reflection) at shallow depths and can't be used to make wires deep in the z-direction (this may also explain uses of gold or silver—both excellent conductors of electricity, as they provide the means from which to maintain the resistivity of the wire when its cross sectional area is limited by lithographic restraints).

The invention describes a process which dramatically reduces the ground rules attainable in ceramic packaging. The invention greatly improves the resolution of greensheet personalization and eliminates defects associated with contact methods like screen printing (e.g. extra of paste shorting adjacent lines). Chemical compositions of composite resists can be standardized (and therefore mass produced) which is an advantage over pastes that must be reformulated for every change in ground rules and each substrate composition.

Because the circuit pattern is exposed on a carrier and subsequently transferred to a substrate, the substrate need not be planer. This allows the potential for the fabrication of three dimensional circuits.

While the invention has been described in terms of preferred embodiments, those skilled in the art will recognize that the invention can be practiced with modification within the spirit and scope of the appended claims.

What is claimed is:

1. A method of forming a conductive pattern on a ceramic sheet, said method comprising:

depositing a photosensitive conductive material on a carrier;

exposing a pattern of x-ray energy on said material; and sintering said carrier and said material to said ceramic sheet such that only said conductive pattern of said material remains on said ceramic sheet.

2. The method in claim 1, further comprising, after said exposing, developing said material and rinsing said material to remove portions of said material patterned by said exposing.

3. The method in claim 1, wherein said conductive pattern matches said pattern of x-ray energy.

4. The method in claim 1, wherein said exposing process exposes said pattern of x-ray energy through a non-contact mask.

5. The method in claim 1, wherein said sintering process removes said carrier and allows only said material to remain on said ceramic sheet.

6. The method in claim 1, wherein said material comprises a composite of a metal and a photosensitive agent.

7. The method in claim 1, wherein said metal includes one of gold, nickle, molybdenum, and copper.

8. A method of forming a conductive pattern on a ceramic sheet comprising:

forming a metallic photosensitive composite on a carrier;

exposing said conductive pattern on said composite using X-ray radiation through a mask, wherein said X-ray radiation has a wavelength that is optimized relative to a K adsorption edge of said composite;

mounting said composite and said carrier on said ceramic sheet; and sintering said composite to said ceramic sheet, wherein said sintering removes said carrier from said composite.

9. The method in claim 8, wherein said mask is a non-contact mask.

10. The method in claim 8, wherein said metallic composite comprises a metal and photosensitive agent.

11. The method in claim 10, wherein said metal comprises one of gold, nickel, molybdenum, and copper.

12. The method in claim 8, further comprising, after said exposing developing said material and rinsing said material to remove portions of said material patterned by said exposing.

* * * * *